US012025924B2

(12) United States Patent
Egashira

(10) Patent No.: US 12,025,924 B2
(45) Date of Patent: Jul. 2, 2024

(54) METHOD OF DETERMINING SET OF SAMPLE SHOT REGIONS, METHOD OF OBTAINING MEASUREMENT VALUE, INFORMATION PROCESSING APPARATUS, LITHOGRAPHY APPARATUS, STORAGE MEDIUM, AND ARTICLE MANUFACTURING METHOD

(71) Applicant: CANON KABUSHIKI KAISHA, Tokyo (JP)

(72) Inventor: Shinichi Egashira, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 233 days.

(21) Appl. No.: 17/463,769

(22) Filed: Sep. 1, 2021

(65) Prior Publication Data
US 2022/0100108 A1 Mar. 31, 2022

(30) Foreign Application Priority Data
Sep. 25, 2020 (JP) ................................ 2020-161328

(51) Int. Cl.
*G03F 9/00* (2006.01)
*H01L 21/66* (2006.01)
(52) U.S. Cl.
CPC .......... *G03F 9/7046* (2013.01); *G03F 9/7088* (2013.01); *H01L 22/20* (2013.01)
(58) Field of Classification Search
CPC .... H01G 9/2031; H01G 9/2036; H01G 9/204; H01G 9/2059; Y02E 10/542; Y02E 10/549; C09D 11/03; C09D 11/033; G03F 9/7046; G03F 9/7088; H01L 22/20; H01L 22/12; H10K 30/152; H10K 30/353; H10K 30/82; H10K 85/633; H10K 85/636

See application file for complete search history.

(56) References Cited

U.S. PATENT DOCUMENTS 5,808,910 A * 9/1998 Irie ....................... G03F 9/7003
356/399
9,052,604 B2 * 6/2015 Chung .................. G03F 9/7046
(Continued)

FOREIGN PATENT DOCUMENTS

CN 111670411 A 9/2020
JP H06232028 A 8/1994
(Continued)

OTHER PUBLICATIONS

Office Action issued in Taiwanese Appln. No. 110132291, mailed Jan. 11, 2024. English translation provided.

*Primary Examiner* — Deoram Persaud
(74) *Attorney, Agent, or Firm* — ROSSI, KIMMS & McDOWELL LLP

(57) ABSTRACT

Provided is a method of determining, out of a plurality of shot regions of a substrate, a set of sample shot regions in each of which a position of a mark is to be actually measured. The method includes setting an initial arrangement of the set of sample shot regions, and adding, to the set of sample shot regions, a shot region, among the shot regions other than the sample shot regions in the initial arrangement, in which a value indicating uncertainty of an estimate of a measurement value of a position of a mark obtained using an estimation model exceeds a predetermined threshold value.

20 Claims, 14 Drawing Sheets

(56) References Cited

U.S. PATENT DOCUMENTS

| | | | |
|---|---|---|---|
| 10,545,412 B2 | 1/2020 | Chang | |
| 10,707,107 B2* | 7/2020 | Riggs | G01B 11/272 |
| 11,099,486 B2 | 8/2021 | Ypma | |
| 2003/0202182 A1* | 10/2003 | Matsumoto | G03F 9/7092 |
| | | | 356/401 |
| 2007/0109524 A1* | 5/2007 | Kawakubo | G03F 7/705 |
| | | | 355/53 |
| 2008/0228435 A1* | 9/2008 | Lee | G03F 7/70633 |
| | | | 702/150 |
| 2011/0154272 A1* | 6/2011 | Hsu | G03F 7/70633 |
| | | | 716/50 |
| 2016/0246185 A1* | 8/2016 | Ypma | G03F 7/70525 |
| 2020/0371441 A1 | 11/2020 | Tel et al. | |
| 2022/0269187 A1* | 8/2022 | Shigenobu | G03F 9/7011 |
| 2023/0108056 A1* | 4/2023 | Shigenobu | G03F 9/7003 |
| | | | 355/27 |

FOREIGN PATENT DOCUMENTS

| | | |
|---|---|---|
| JP | 2010040553 A | 2/2010 |
| WO | 2018133999 A1 | 7/2018 |

* cited by examiner

FIG. 4
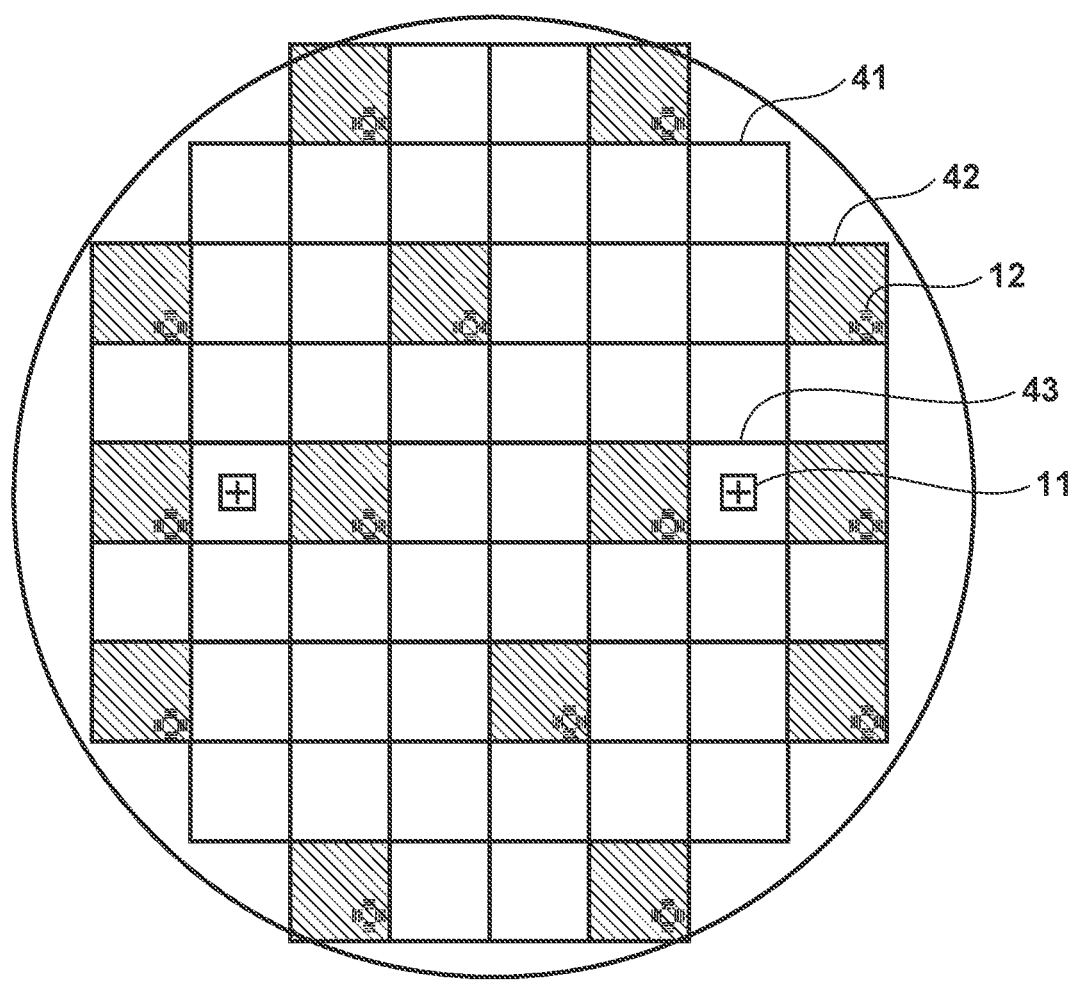
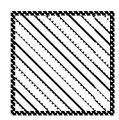 SAMPLE SHOT REGION
 PREALIGNMENT MARK
 FINE ALIGNMENT MARK FIG. 10
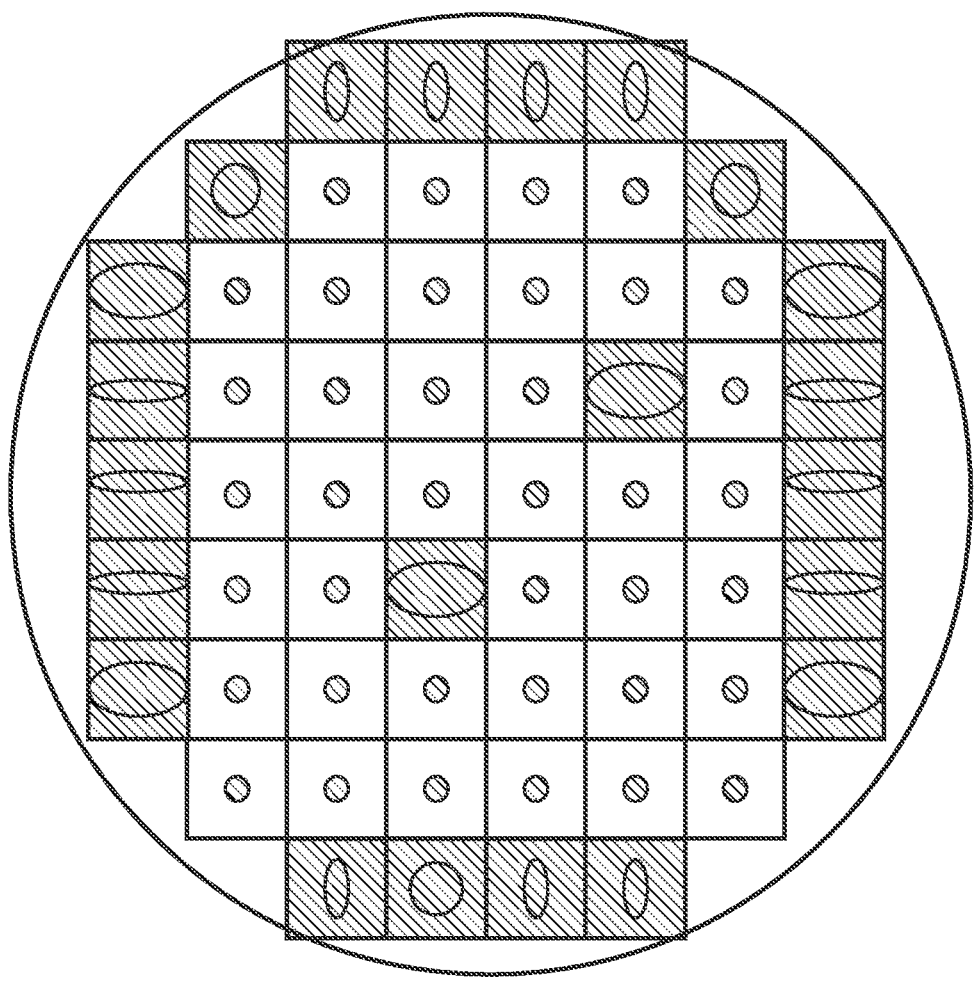
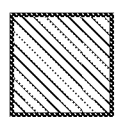 SAMPLE SHOT REGION

METHOD OF DETERMINING SET OF SAMPLE SHOT REGIONS, METHOD OF OBTAINING MEASUREMENT VALUE, INFORMATION PROCESSING APPARATUS, LITHOGRAPHY APPARATUS, STORAGE MEDIUM, AND ARTICLE MANUFACTURING METHOD

BACKGROUND OF THE INVENTION

Field of the Invention

The present invention relates to a method of determining a set of sample shot regions, a method of obtaining a measurement value, an information processing apparatus, a lithography apparatus, a storage medium, and an article manufacturing method.

Description of the Related Art

Along with micropatterning and higher integration of devices, demand for improvement of device alignment accuracy is growing. In order to improve the alignment accuracy, it is necessary to inspect an alignment shift (to be referred to as overlay hereinafter) with high accuracy and control the offset based on the alignment shift. Therefore, demand for increased overlay inspection accuracy is also growing.

In order to perform alignment and overlay inspection with high accuracy, it is necessary to increase the number of measurement points on a measurement target object (such as a wafer or a panel, which is to be referred to as a substrate hereinafter). However, increasing the number of measurement points leads to an increase in measurement/inspection time, and the productivity is decreased. To prevent this, each of International Publication No. 2018/133999 and U.S. Pat. No. 10,545,412 proposes a Virtual Metrology system. This system uses a statistical model based on data of various kinds of sensors during an operation of an apparatus, an operation log in a device manufacturing process, the type of the apparatus that processed the substrate, and the like to estimate the value of a point which has not actually undergone measurement/inspection. This enables a virtual increase of the number of measurement points.

The Virtual Metrology system enables reducing the number of measurement points. However, currently, the number of measurement points is reduced by trial and error, and no clear reducing method has been established.

SUMMARY OF THE INVENTION

The present invention provides, for example, a technique for determining a measurement position on a substrate, which is advantageous in improving the alignment accuracy of the substrate.

The present invention in its one aspect provides a method of determining, out of a plurality of shot regions of a substrate, a set of sample shot regions in each of which a position of a mark is to be actually measured, comprising setting an initial arrangement of the set of sample shot regions, and adding, to the set of sample shot regions, a shot region, among the shot regions other than the sample shot regions in the initial arrangement, in which a value indicating uncertainty of an estimate of a measurement value of a position of a mark obtained using an estimation model exceeds a predetermined threshold value.

Further features of the present invention will become apparent from the following description of exemplary embodiments (with reference to the attached drawings).

BRIEF DESCRIPTION OF THE DRAWINGS

FIG. 4 is a view showing an example of the layout of sample shot regions on a substrate;

FIG. 10 is a view showing an example of the sample shot regions selected based on the variance;

DESCRIPTION OF THE EMBODIMENTS

Figure 1:
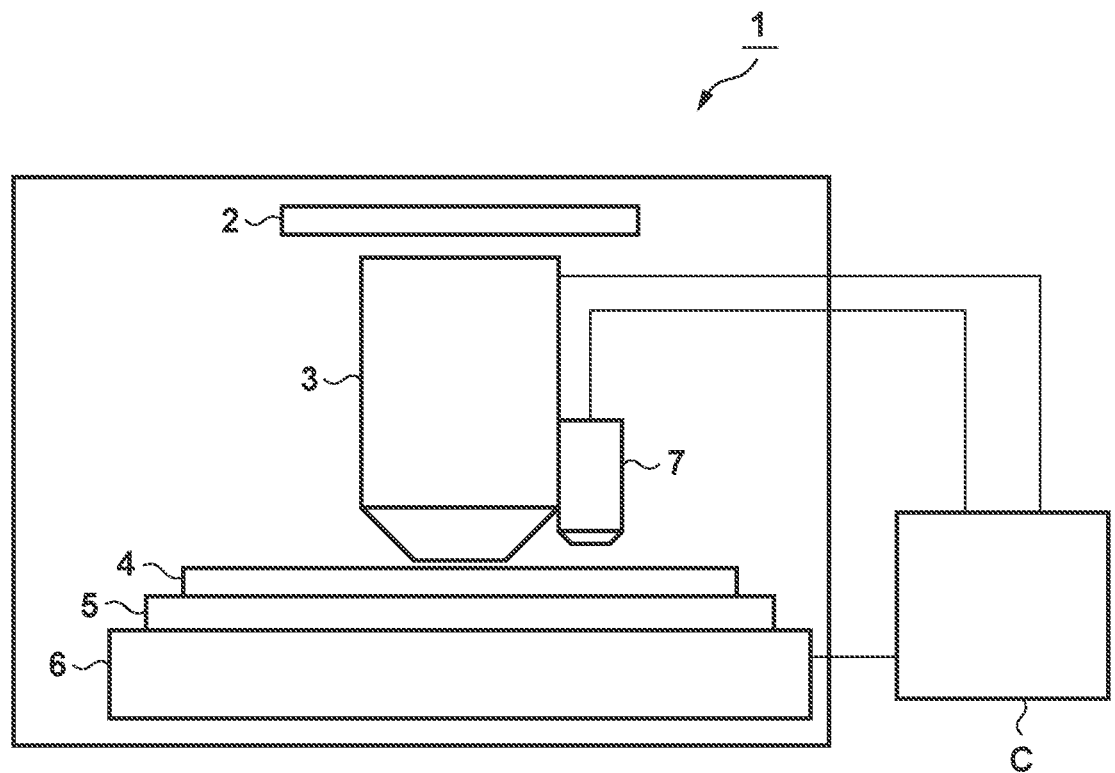
FIG. 1 is a view showing the arrangement of an exposure apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

The present invention provides a technique for determining the position of a measurement point on a substrate, which is advantageous in improving the alignment accuracy of the substrate, and a lithography apparatus applied with such the technique will be described below. As one specific example, an example will be described below in which the present invention is applied to an exposure apparatus which is one example of a lithography apparatus. However, the lithography apparatus is not limited to the exposure apparatus, and may be another lithography apparatus. For example, the lithography apparatus may be a drawing apparatus that performs drawing on a substrate (a photosensitive agent thereon) using a charged particle beam. Alternatively, the lithography apparatus may be an imprint apparatus that forms a pattern on a substrate by molding an imprint material on the substrate using a mold.

First Embodiment

FIG. 1 is a view showing the arrangement of an exposure apparatus 1 according to an embodiment. The exposure apparatus 1 includes a projection optical system 3, a substrate chuck 5, a substrate stage 6, and an alignment detection optical system 7. A pattern (for example, a circuit pattern) to be transferred to a substrate 4 is drawn on an original 2, which is also referred to as a reticle, and the original 2 is supported by an original stage (not shown). The projection optical system 3 projects, onto the substrate 4, the original 2 on which the pattern (for example, the circuit pattern) has been drawn. The substrate chuck 5 holds the substrate 4 in which an underlying pattern and alignment marks have been formed in a preceding step.

As shown in FIG. 4, a plurality of shot regions 41, each of which is a transfer region of the pattern of the original 2, are arrayed in a grid pattern in the substrate 4. In each shot region, the underlying pattern and the alignment mark transferred (formed) in the preceding step are formed. In general, the same patterns are formed in the respective shot regions. In a predetermined shot region 43 among the plurality of shot regions 41, a prealignment mark 11 used in prealignment, which is rough alignment, is formed. Further, in a region determined in advance as a sample shot region 42 among the plurality of shot regions 41, a fine alignment mark 12 used in fine alignment is formed.

The substrate stage 6 positions the substrate 4 at a predetermined position. The alignment detection optical system 7 can include an imaging device that captures the alignment mark on the substrate 4 and obtains the image of the mark. A controller C comprehensively controls respective units for an exposure process. The controller C can be implemented by an information processing apparatus (computer) including a CPU and a memory. Such a computer may include a display unit that displays various kinds of information. In the embodiment, the controller C can function as a processing unit that performs a process of obtaining the position of the mark by processing the image obtained by the alignment detection optical system 7.

In an example, the controller C detects the relative position between the original 2 and the substrate 4 using the alignment detection optical system 7, and alignment is performed by controlling the substrate stage 6 based on the detection result. After this, the controller C causes an illumination optical system (not shown) to emit exposure light, and the projection optical system 3 projects the pattern drawn in the original 2 onto the substrate 4 using the exposure light.

Figure 2:
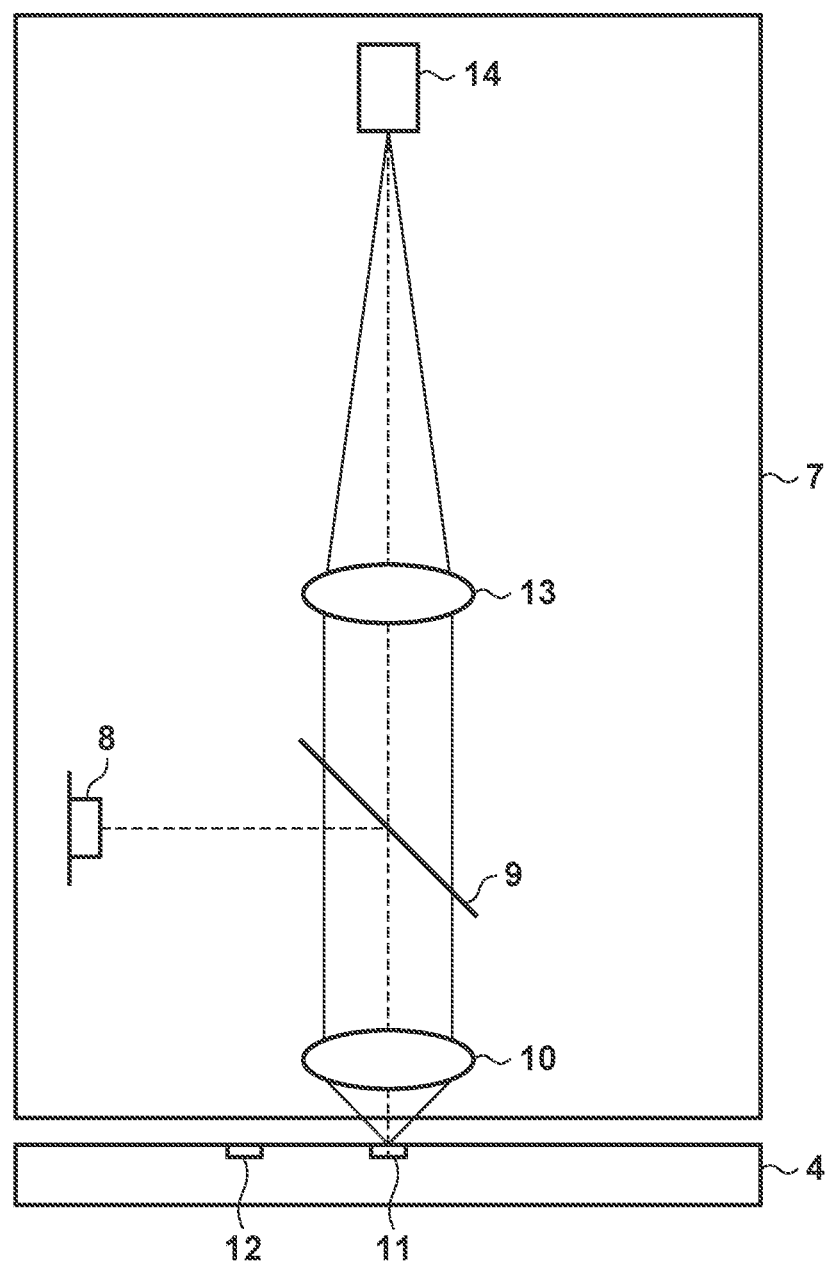
FIG. 2 is a view showing the arrangement of an alignment detection optical system.

FIG. 2 shows the arrangement of the alignment detection optical system 7. Illumination light from a light source 8 is reflected by a beam splitter 9, passes through a lens 10, and illuminates the alignment mark 11 on the substrate 4. Diffracted light from the alignment mark 11 passes through the lens 10, the beam splitter 9, and a lens 13, and forms the image of the alignment mark 11 on a sensor 14. The sensor 14 photoelectrically converts the formed image into an image signal, and transmits the image signal to the controller C. The controller C performs a position detection process on the received image signal to measure the position of the alignment mark. The controller C performs such mark position measurement for measurement points on a plurality of sample shot regions in the substrate 4 to be described later, and obtains the virtual measurement value of the position of a mark in a shot region other than the sample shot region using a Virtual Metrology technique. Based on the measurement value in each shot region obtained as described above, the controller C aligns the position of the substrate stage 6 with the original 2.

Figure 3:
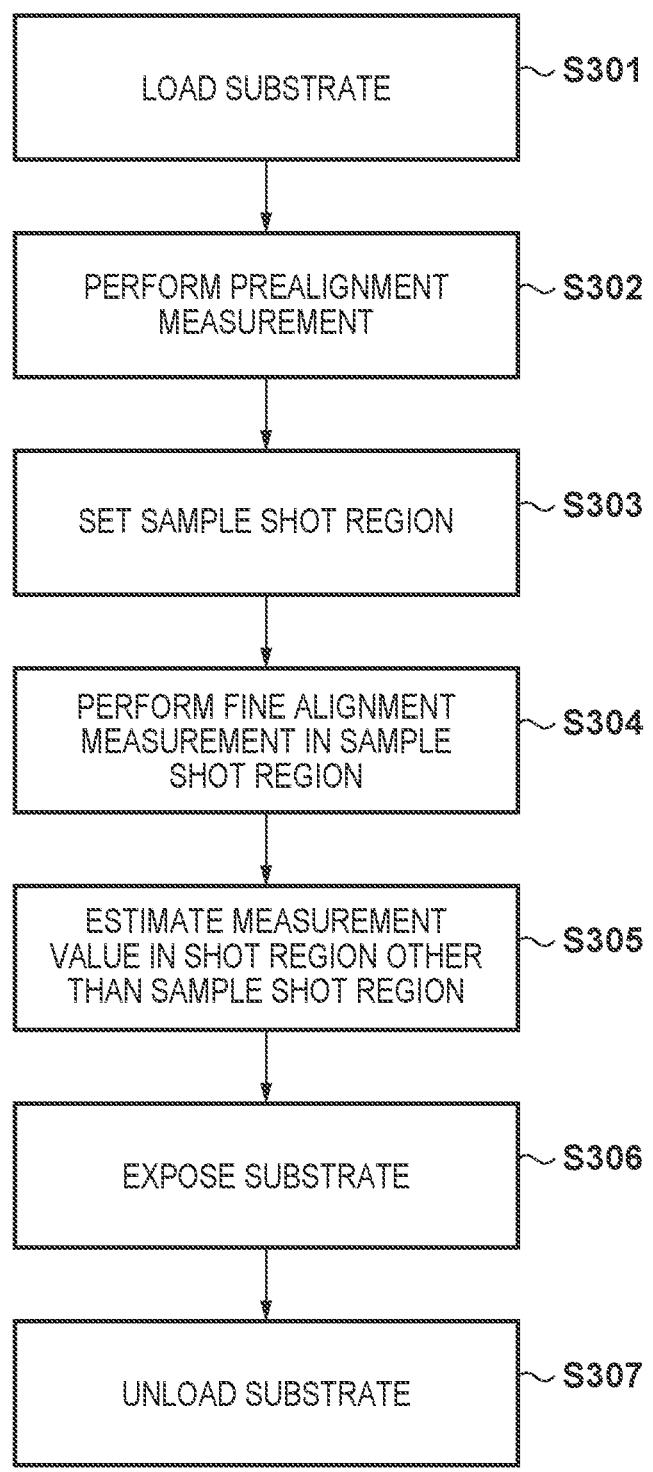
FIG. 3 is a flowchart of an exposure process.

A series of steps of the exposure apparatus 1 from alignment to exposure of the substrate will be described below with reference to the flowchart of FIG. 3. In step S301, the substrate 4 is loaded into the exposure apparatus 1, and the substrate 4 is held by the substrate chuck 5.

In step S302, prealignment measurement is performed. In the prealignment measurement, the position of the prealignment mark 11 on the substrate is detected by the alignment detection optical system 7. Detection of the prealignment mark 11 by the alignment detection optical system 7 is performed on a plurality of shot regions for prealignment, in each of which the prealignment mark 11 has been formed. Based on the detection results, the controller C calculates the shift and first-order linear components (magnification and rotation) of the entire substrate.

Next, in step S303, the controller C sets the arrangement of the sample shot regions optimized for fine alignment. The sample shot region is the shot region, among the plurality of shot regions of the substrate, where the position of the mark should be actually measured. A method of determining a set of the sample shot regions will be described later.

Then, in step S304, fine alignment measurement is performed. In the fine alignment measurement, the controller C drives, based on the prealignment measurement results, the substrate stage 6 to a position where the alignment detection optical system 7 can observe the fine alignment mark 12. Thereafter, the controller C uses the alignment detection optical system 7 to measure the position of the fine alignment mark 12 in the sample shot region.

In step S305, the controller C estimates the alignment measurement value in the shot region other than the sample shot region using an estimation model of the measurement value (to be referred to as the "alignment measurement value" hereinafter) of the position of a mark. That is, actual measurement need not be performed on the shot region other than the sample shot region. From actual measurement of the sample shot regions and estimation of the alignment measurement values in the shot regions other than the sample shot region, accurate alignment measurement values of all the shot regions on the substrate can be obtained.

In step S306, for each shot region, the controller C drives the substrate stage 6 based on the fine alignment measurement results obtained in steps S304 and S305, projects the pattern of the original 2 onto the substrate via the projection optical system 3, and exposes the substrate. Then, in step S307, the exposed substrate is unloaded.

The controller C has a function of correcting the high-order deformation components when a distortion has occurred in the substrate 4. The function will be described. Here, an example of the third-order polynomial model is shown, but the correction model is not limited to that shown in this embodiment. An arbitrary-order mold may be used, or another model other than the polynomial model may be used.

When a deformation in the substrate is expressed by the third-order polynomial model, correction values (ShiftX and ShiftY) of each shot region are expressed by following equation (1):

$$ShiftX = k_1 + k_3 x + k_5 y + k_7 x^2 + k_9 xy + k_{11} y^2 + k_{13} x^3 + k_{15} x^2 y + k_{17} xy^2 + k_{19} y^3$$

$$ShiftY = k^2 + k_4 y + k_6 x + k_8 y^2 k_{10} xy + k_{12} x^2 + k_{14} y^3 + k_{16} xy^2 + k_{18} x^2 y + k_{20} x^3 \tag{1}$$

where x and y indicate the position of the shot region in the substrate surface. The controller C obtains regression coefficients $k_1$ to $k_{20}$ from the actual alignment measurement value in each shot region to calculate the correction value.

For example, in order to obtain the actual measurement data, alignment measurement can be performed on some shot regions on the substrate. The shot regions used at this time are referred to as sample shot regions. In the example shown in FIG. 4, a set of sample shot regions including 14 sample shot regions is set. In order to correct the high-order substrate deformation component, the larger number of sample shot regions is required. However, since there is a trade off between increasing the number of sample shot regions and the alignment measurement time, the number of sample shot regions is determined in consideration of the device productivity.

Next, the Virtual Metrology system will be described. Note that the model structure shown here is merely an example, and the present invention is not limited to this model.

Figure 5:
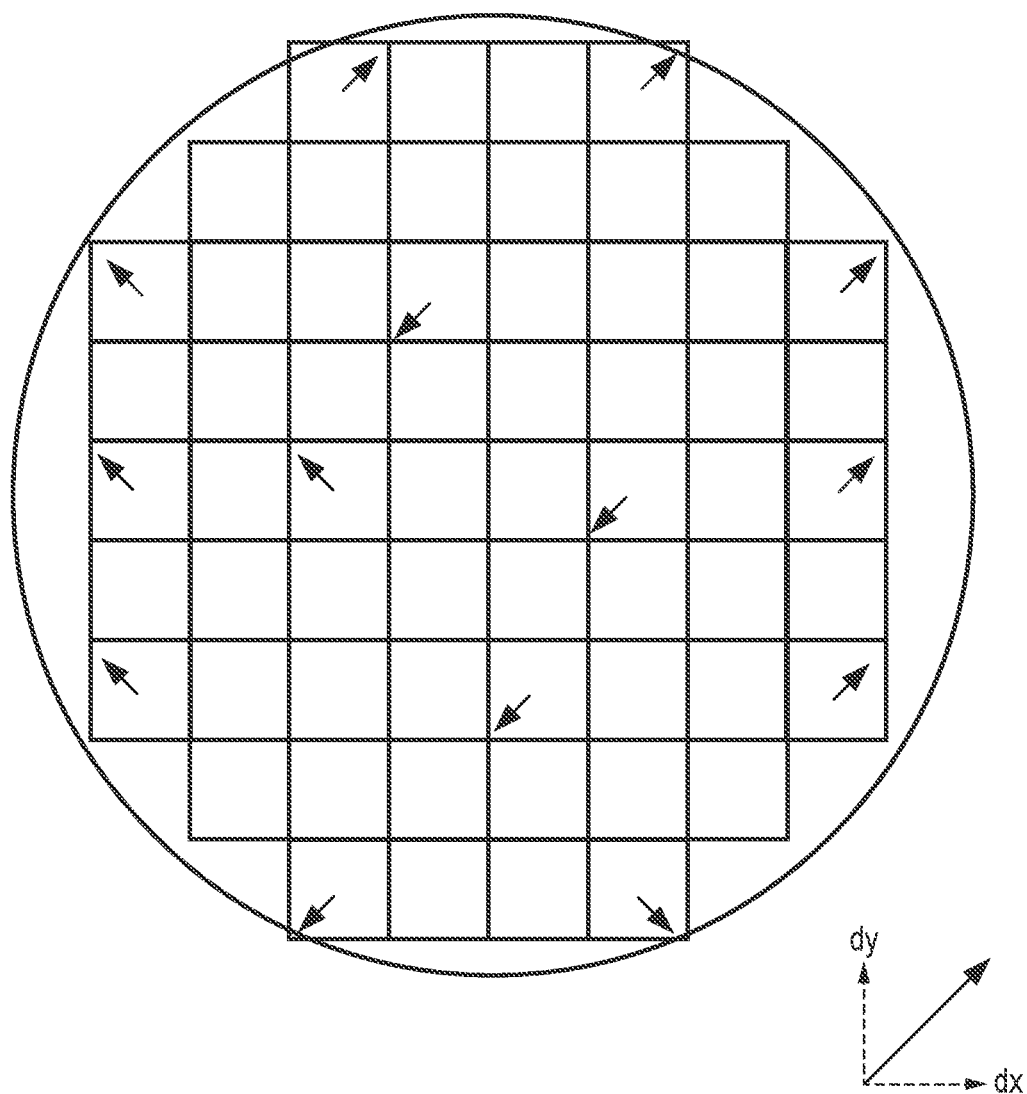
FIG. 5 is a view in which the alignment measurement value in each sample shot region is represented by a vector representation.
Figure 6:
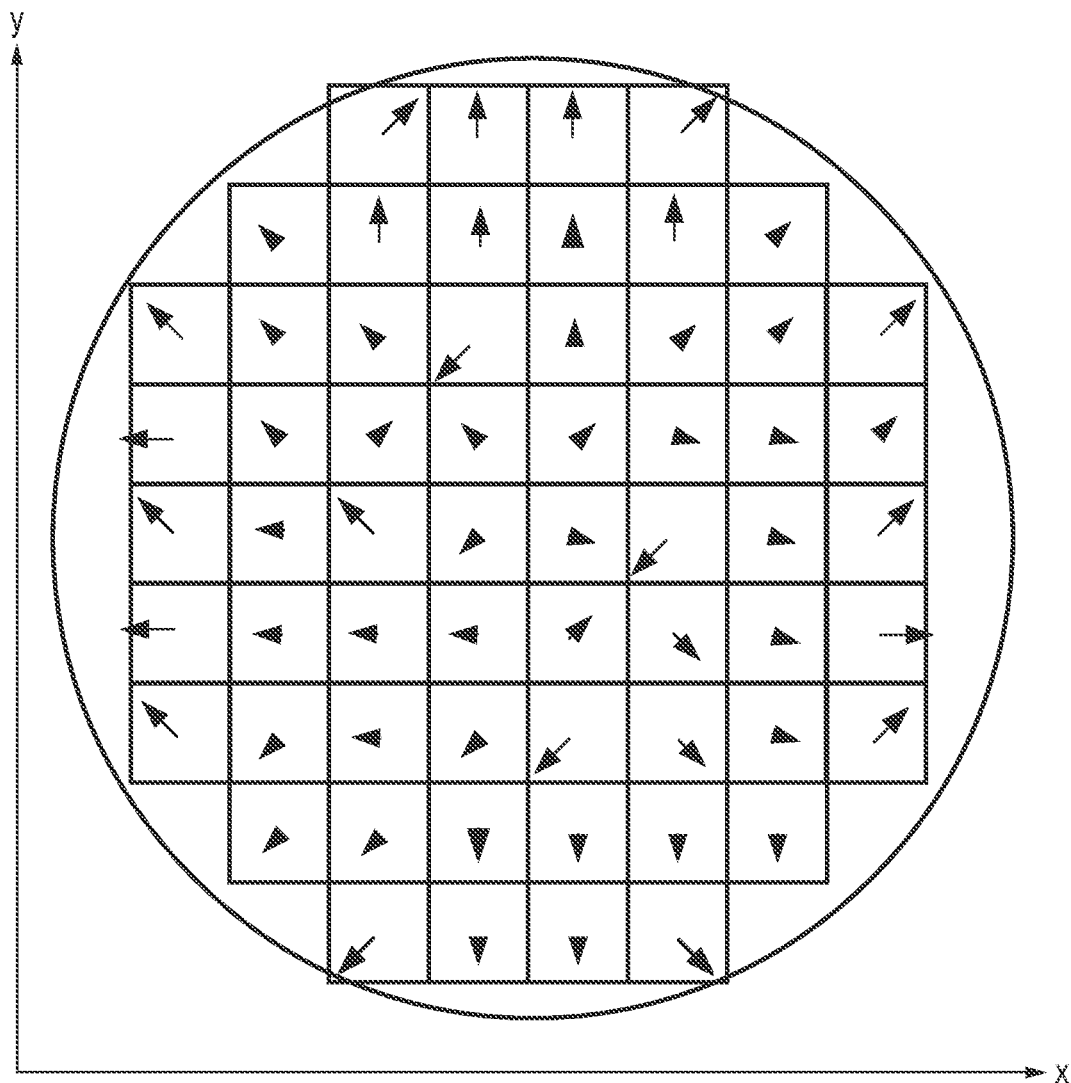
FIG. 6 is a view in which the virtual alignment measurement value in each shot region is represented by a vector representation.

Here, assume that a set of sample shot regions is determined as shown in FIG. 4. Actual alignment measurement is performed only in the sample shot region. In FIG. 5, alignment measurement values dx and dy obtained in each sample shot region are represented by a vector representation. Each vector corresponds to the alignment measurement values in each sample shot region. The controller C uses various kinds of data to estimate the alignment measurement value in the shot region (that is, the shot region other than the sample shot region) where actual measurement has not been performed, and obtains the virtual alignment measurement value as shown in FIG. 6. This is the outline of the Virtual Metrology system.

Figure 7:
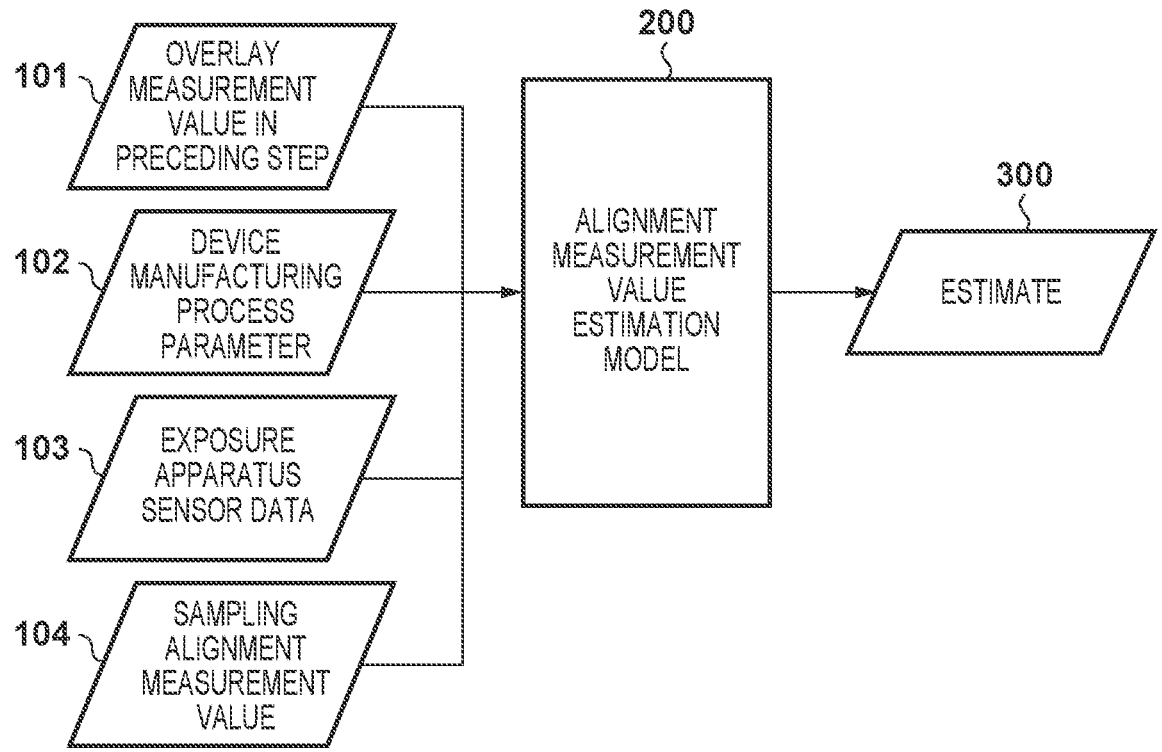
FIG. 7 is a view showing a configuration example of a Virtual Metrology system that estimates the alignment measurement value.

The estimation function of the system will be described below. FIG. 7 shows a configuration example of the Virtual Metrology system. In this system, following data serve as input data to an alignment measurement value estimation model 200:

an overlay measurement value 101 (an overlay measurement value between the upper and lower layers) in the preceding step;
a device manufacturing process parameter 102;
exposure apparatus sensor data 103; and
a sampling alignment measurement value 104, which is the alignment measurement value in a sample shot region obtained by actual measurement.

The device manufacturing process parameter 102 can include parameters related to device manufacturing such as, for example, the ID of the device manufacturing apparatus that has processed the substrate, the warping amount of the substrate that has occurred in the manufacture of the device, and the apparatus parameter upon applying a resist agent on the substrate. The exposure apparatus sensor data 103 can include, for example, the pressure value at the time of the substrate stage fixing the substrate by suction, the substrate temperature at the time of substrate temperature control, the history of the exposure heat load generated in the exposure apparatus, the mark image data at the time of alignment measurement, and the like. The sampling alignment measurement value 104 corresponds to the alignment measurement value in the sample shot region shown in FIG. 5.

Based on these input data, the alignment measurement value estimation model 200 estimates the alignment measurement value in the shot region other than the sample shot region, and outputs an estimate 300 of the alignment measurement value in each shot region. The vector representation of the estimate 300 is as shown in FIG. 6. The estimation model 200 is a model in which the input/output relationship has been learned in advance by machine learning or the like.

Figure 8:
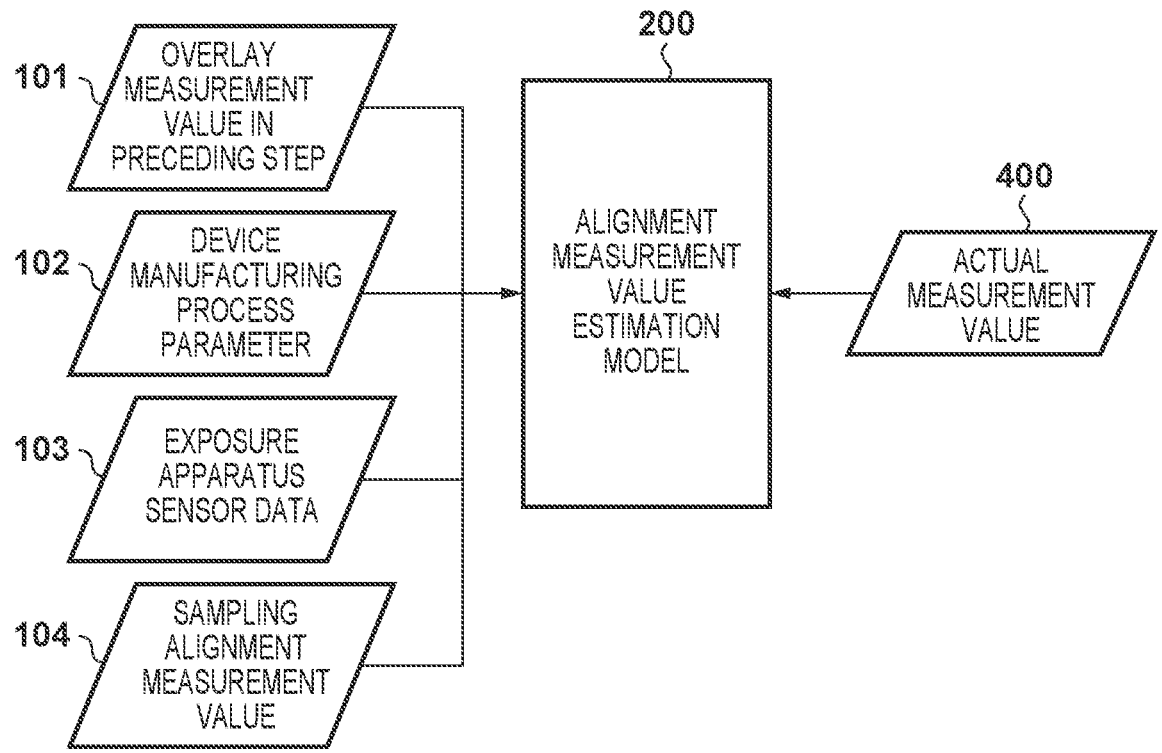
FIG. 8 is a view showing the data flow during learning of an alignment measurement value estimation model.

FIG. 8 shows the data flow during learning of the estimation model 200. During learning, parameters inside the estimation model are learned while using an actual measurement value 400, which is the alignment measurement value in the shot region where alignment measurement was actually performed, as teacher data. The format of the actual measurement value 400 serving as the teacher data is similar to that of the estimate 300, that is, the format of the measurement value as shown in FIG. 6.

By using the estimation model 200 learned as described above, the alignment measurement value in a shot region (a shot region other than the sample shot region) where alignment measurement has not been performed is estimated. Thus, correction of the high-order substrate deformation component is implemented, and it becomes possible to perform highly accurate alignment.

Figure 9:
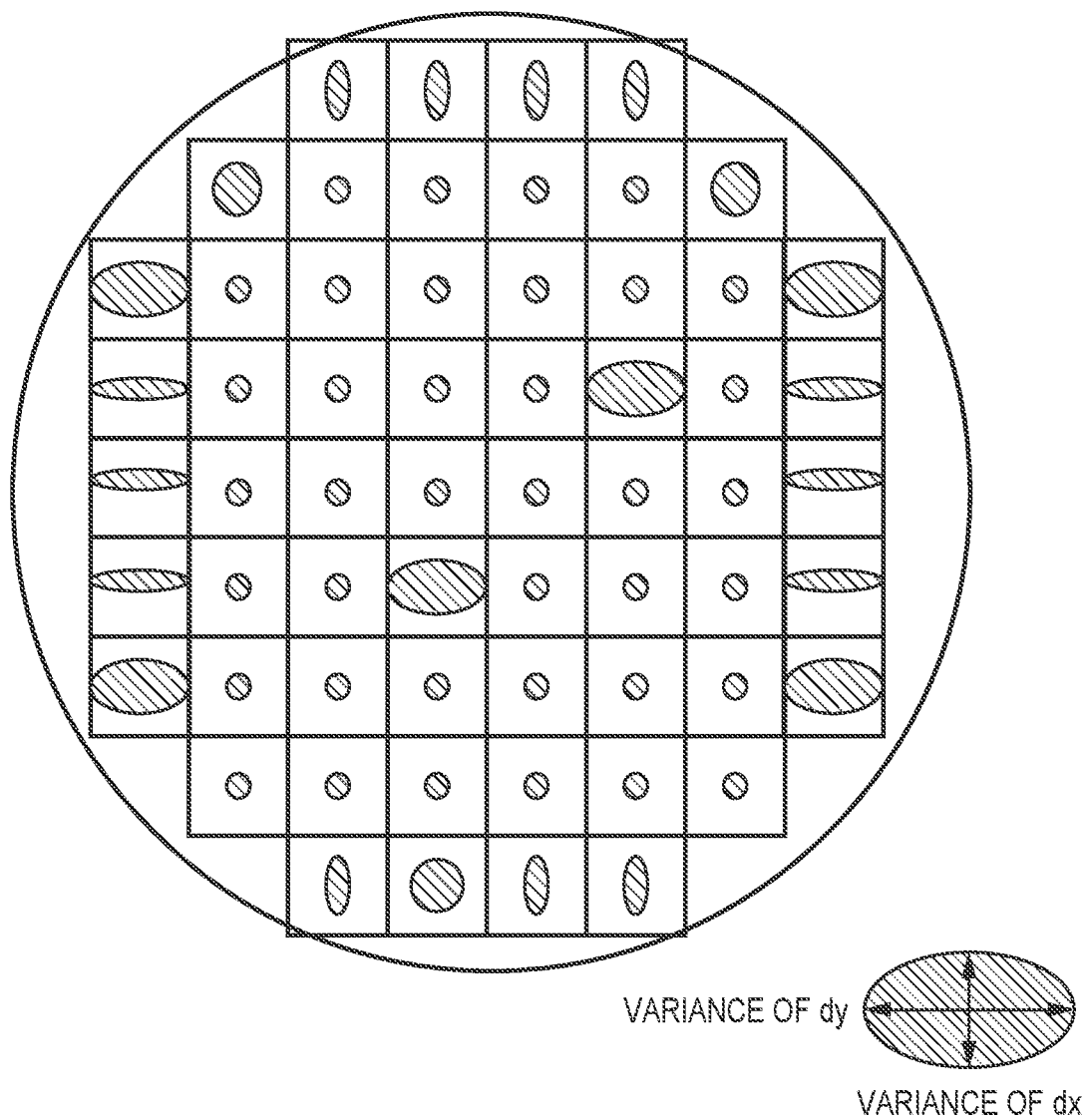
FIG. 9 is a view exemplarily showing the variance of the probability distribution of the estimation error of the alignment measurement value in each shot region.

Next, a method of determining the sample shot region according to the embodiment will be described. The controller C calculates the estimation error of the estimate 300 of each shot region from the plurality of substrate data used for learning of the estimation model 200. The estimation error is the difference between the actual measurement value and the estimate. Then, the controller C calculates the inter-data distribution of the estimation error (estimation error distribution) in each shot region. This distribution represents the distribution of the probability of occurrence of the estimation error, and represents the uncertainty of the estimate in the shot region. For example, when the variance of the estimation error distribution is used, the variance can be represented as shown in FIG. 9. The horizontal diameter of the ellipse indicates the variance of the estimation error distribution of the alignment shift amount dx in the x direction, and the vertical diameter of the ellipse indicates the variance of the estimation error distribution of the alignment shift amount dy in the y direction. In this example, it can be seen that the closer to the outer periphery of the substrate, the larger the variance of the estimation error distribution tends to be and the higher the uncertainty of the estimate. In order to increase the estimation accuracy of the estimation model, it is advantageous to select the shot region, in which the variance of the estimation error distribution (the uncertainty of the estimate) is high, as the sample shot region where the alignment measurement is actually performed. Therefore, in this embodiment, the shot region in which the variance of the estimation error distribution exceeds a predetermined threshold value is selected as the sample shot region.

FIG. 10 shows an example of the sample shot regions selected because the variance of the estimation error distribution exceeds a predetermined threshold value. Here, if the shot regions, in each of which the variance of the estimation error distribution (the uncertainty of the estimate) is high, are adjacent to each other, both shot regions are selected as the sample shot regions. In the following description, a method for achieving the expected effect by selecting the smaller number of sample shot regions in the case as described above will be described.

Figure 11:
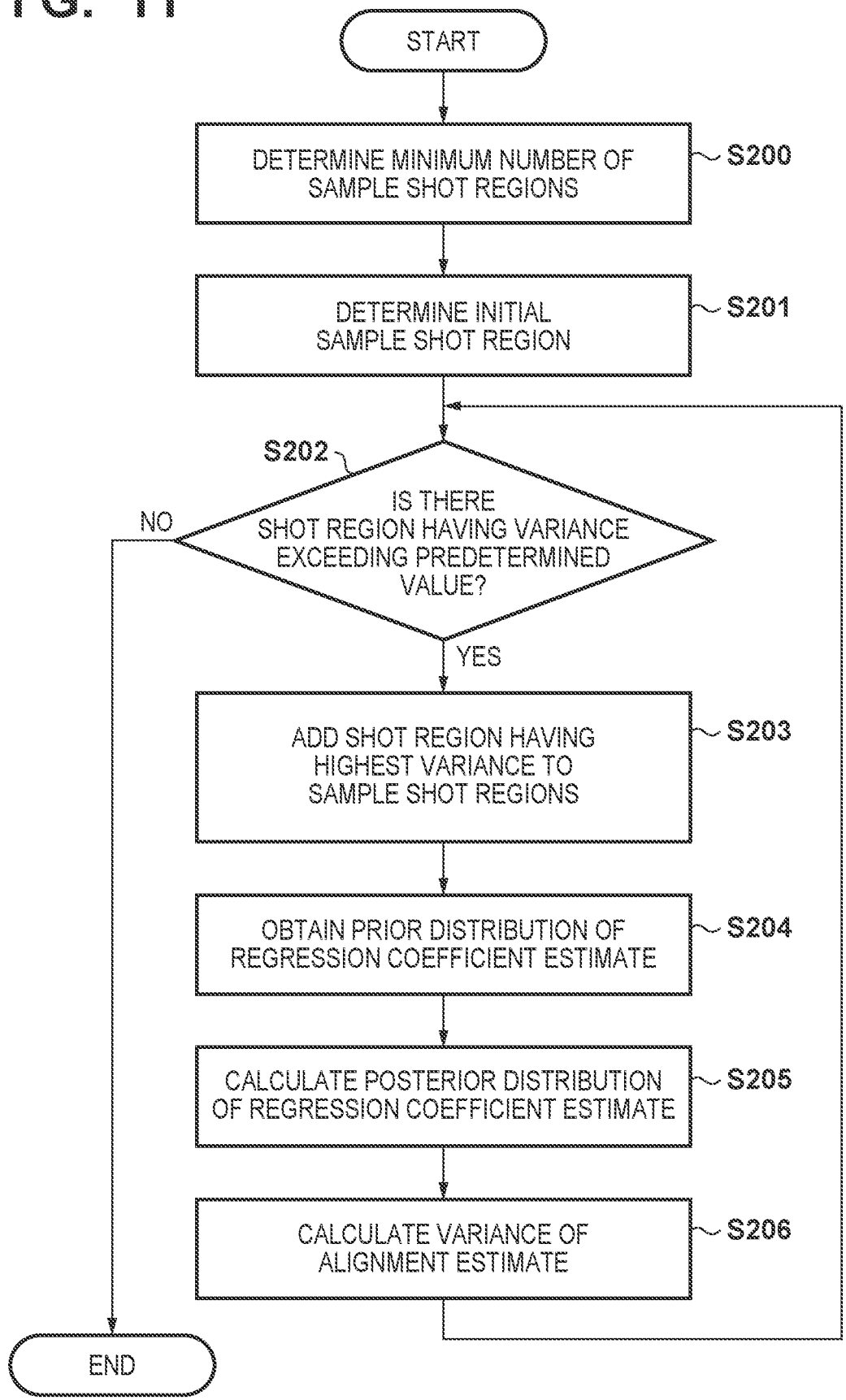
FIG. 11 is a flowchart illustrating a process of determining the sample shot regions.

Here, as an example, an example in which the estimation model is a polynomial regression model is shown. This polynomial regression model learns the regression coefficients of the polynomial when learning the estimation model from teacher data. For example, for a third-order polynomial, the polynomial regression model learns the respective regression coefficients $k_1$ to $k_{20}$ of above-described equation (1). Note that the regression coefficients $k_1$ to $k_6$ are the first-order linear components, and they can be corrected using the actual measurement values during the actual alignment measurement of the sample shot region. Therefore, in practice, the polynomial regression model learns the remaining regression coefficients $k_7$ to $k_{20}$. At this time, the controller C calculates the distribution of the regression coefficients from the regression coefficients in each teacher data. Then, based on the distribution of the regression coefficients, the controller C calculates the distribution of the estimate of the alignment measurement value in each shot region on the substrate. With this, the distribution of the estimate of the alignment measurement value serving as an output value of the polynomial regression model is determined. The controller C uses this to change the sample shot region. A process of determining the sample shot regions will be described below with reference to the flowchart of FIG. 11.

In step S200, the controller C determines the minimum number of sample shot regions. For example, in a case of a third-order polynomial, there are seven second- and higher-order coefficients for each of x and y. More specifically, the second- and higher-order coefficients for x are $k_7$, $k_9$, $k_{11}$, $k_{13}$, $k_{15}$, $k_{17}$, and $k_{19}$. The second- and higher-order coefficients for y are $k_8$, $k_{10}$, $k_{12}$, $k_{14}$, $k_{16}$, $k_{18}$, and $k_{20}$. Therefore, in this case, the minimum number of sample shot regions is set to seven.

Figure 12:
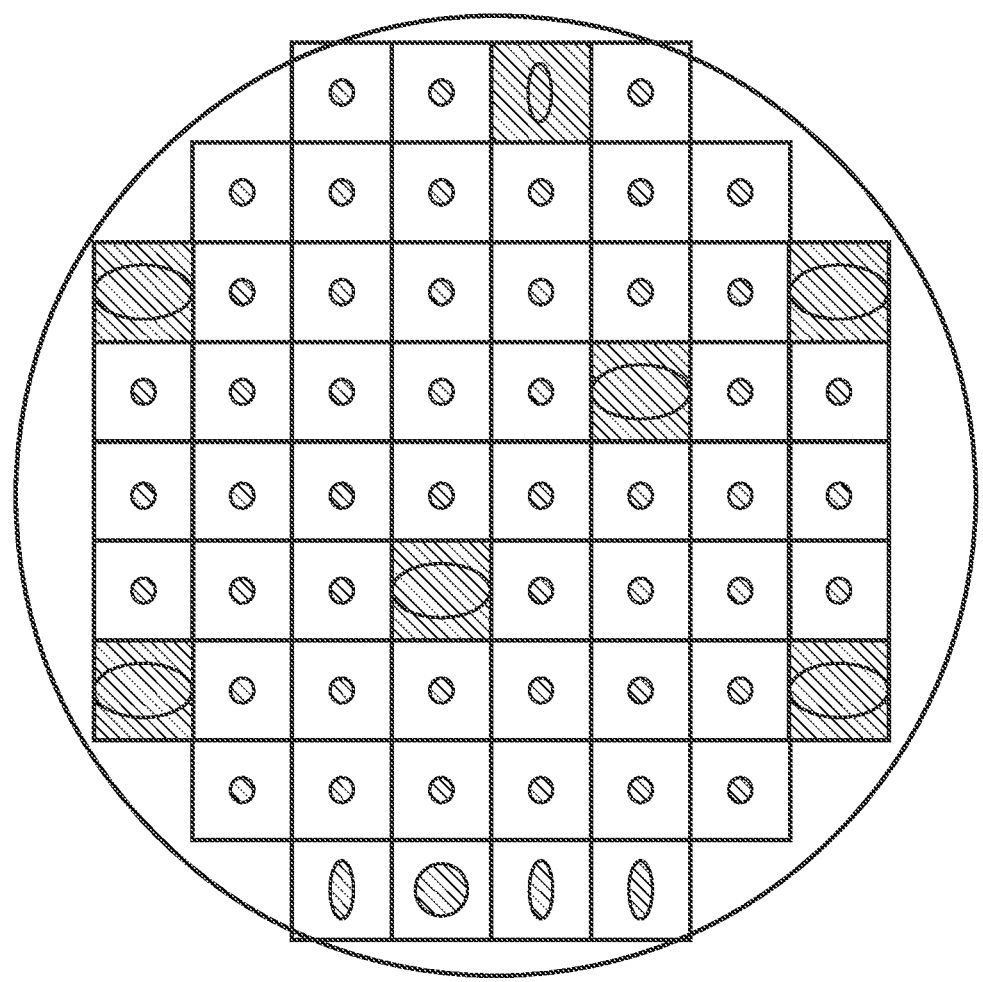
FIG. 12 is a view showing an example of the positions and variances of the initial sample shot regions.

In step S201, the controller C sets the initial arrangement of a set of sample shot regions. The positions of the currently used sample shot regions may be used intact, or the shot regions may be selected in order from the shot region having the highest variance of estimate of the alignment measurement value calculated from the teacher data unless the arrangement becomes unbalanced. FIG. 12 shows an example of the variance of the estimate of the alignment measurement value in the case in which seven sample shot regions are selected.

In step S202, the controller C checks whether, among the shot regions other than the sample shot regions in the initial arrangement, there is the sample region in which the variance of the estimate of the alignment measurement value obtained using the estimation model exceeds a predetermined threshold value. If there is no shot region in which the variance exceeds the threshold value, the determination process is terminated. If there is the shot region in which the variance exceeds the threshold value, the shot region in which the variance exceeds the threshold value is added to the set of sample shot regions. In the embodiment, a process to be described below is performed from step S203.

In step S203, among the shot regions extracted as the shot regions each having the variance exceeding the predetermined threshold value, the shot region having the highest variance is added to the set of sample shot regions. Then, in step S204, the controller C acquires, as prior distribution information, the probability distribution of the regression coefficient obtained during learning. In step S205, the controller C calculates the posterior distribution of the probability distribution of the regression coefficient while assuming that the measurement value in the currently selected sample shot region is the maximum likelihood value of the estimate of the alignment measurement value (first calculation step). For example, Bayesian inference can be used to calculate the posterior distribution. A detailed description of Bayesian inference will be omitted here. In order to calculate the posterior distribution in a case in which additional observed data is obtained for the prior distribution, following equation (2) can be used:

$$p(\theta|D)=p(D|\theta)p(\theta)/p(D) \quad (2)$$

where $\theta$ is a model parameter, D is the observed data, $p(\theta|D)$ is the posterior distribution of the model parameter $\theta$ in a case in which the additional observed data D is obtained, $p(D|\theta)$ is the likelihood function expressing the probability of occurrence of the observed data D from the model parameter $\theta$, $p(\theta)$ is the prior distribution of the model parameter $\theta$, and $p(D)$ is the marginal likelihood of the observed data D.

Note that if the marginal likelihood $p(D)$ cannot be analytically calculated, for example, an MCMC (Markov Chain Monte Carlo) method as a sampling method can be used to calculate the posterior distribution $p(\theta|D)$. Alternatively, it is also possible to calculate the posterior distribution $p(\theta|D)$ using approximate inference such as variational inference in which analytical calculation is performed using an approximate probability distribution.

Figure 13:
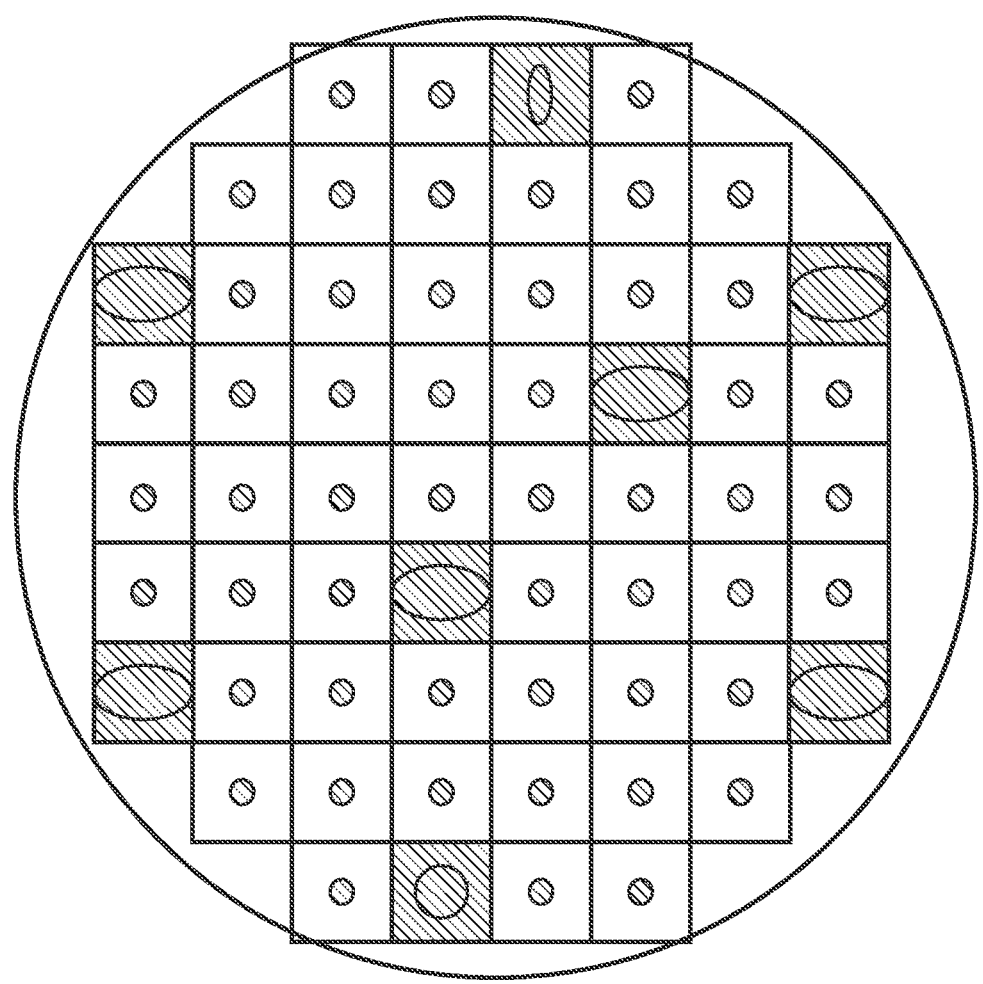
FIG. 13 is a view showing an example of the positions and variances of the sample shot regions after the determination process.

In step S206, the controller C calculates, from the finally calculated posterior distribution of the regression coefficients, the variance of the estimate (to be also referred to as the "alignment estimate" hereinafter) of the alignment measurement value in each shot region (second calculation step). FIG. 13 shows an example of the variances at this time. In FIG. 13, a sample shot region A is added to the initial arrangement shown in FIG. 12. This can decrease the variances (uncertainties) in the vicinity of the sample shot region A.

Thereafter, the process returns to step S202. In step S202, the controller C checks again whether there is the shot region in which the variance of the estimate of the alignment measurement value exceeds the predetermined threshold value other than the currently selected sample shot regions. Thus, steps S202 to S206 are repeated until there is no shot region having the variance exceeding the predetermined threshold value. If it is confirmed in step S202 that there is no shot region having the variance exceeding the predetermined threshold value, the process is terminated. With this, a model that can perform estimation with the expected accuracy can be obtained.

Note that if the model includes the input data (the overlay measurement value 101, the device manufacturing process parameter 102, or the exposure apparatus sensor data 103) other than sampling alignment measurement value 104, each data may be dealt as the maximum likelihood value of the learning data. Alternatively, actual data may be used at a timing when the input data is obtained during the actual estimation process.

Note that it has been described above that the alignment mark in the sample shot region is arranged at one point in the sample shot region, but the present invention is not limited to this. A plurality of alignment marks may be included in the sample shot region, and a model that also expresses the shape of the sample shot region by measuring the plurality of alignment marks may be used. Further, the measurement value regarding the sample shot region has been described as the alignment measurement value representing the position (shift amount) of the mark in each of the x and y directions parallel to the surface of the substrate, but the present invention is not limited to this. The shift amounts in the x and y directions may be replaced with, for example, a focus measurement value in each shot region that represents the shift amount in the z direction which is a direction perpendicular to the surface of the substrate.

The estimation model may be formed by, for example, a neural network. Here, the neural network is a model having a multi-layer network structure including an input layer, an intermediate layer, an output layer, and the like. During learning of the estimation model, by using learning data indicating the relationship between the input data and the teacher data, an algorism such as an error backpropagation optimizes the coupling weighting coefficient or the like in the neural network. The error backpropagation method is a method of adjusting the coupling weighting coefficient or the like between the respective nodes of the neural network such that the error between the output data and the teacher data becomes small.

The information of the set of sample shot regions determined by the above-described method may be notified to the user by, for example, displaying the information on the display unit.

Second Embodiment

In the second embodiment, a Virtual Metrology system that estimates an overlay measurement value, which is the relative position between an overlay mark in an upper layer and an overlay mark in a lower layer of a substrate will be described below.

Figure 14:
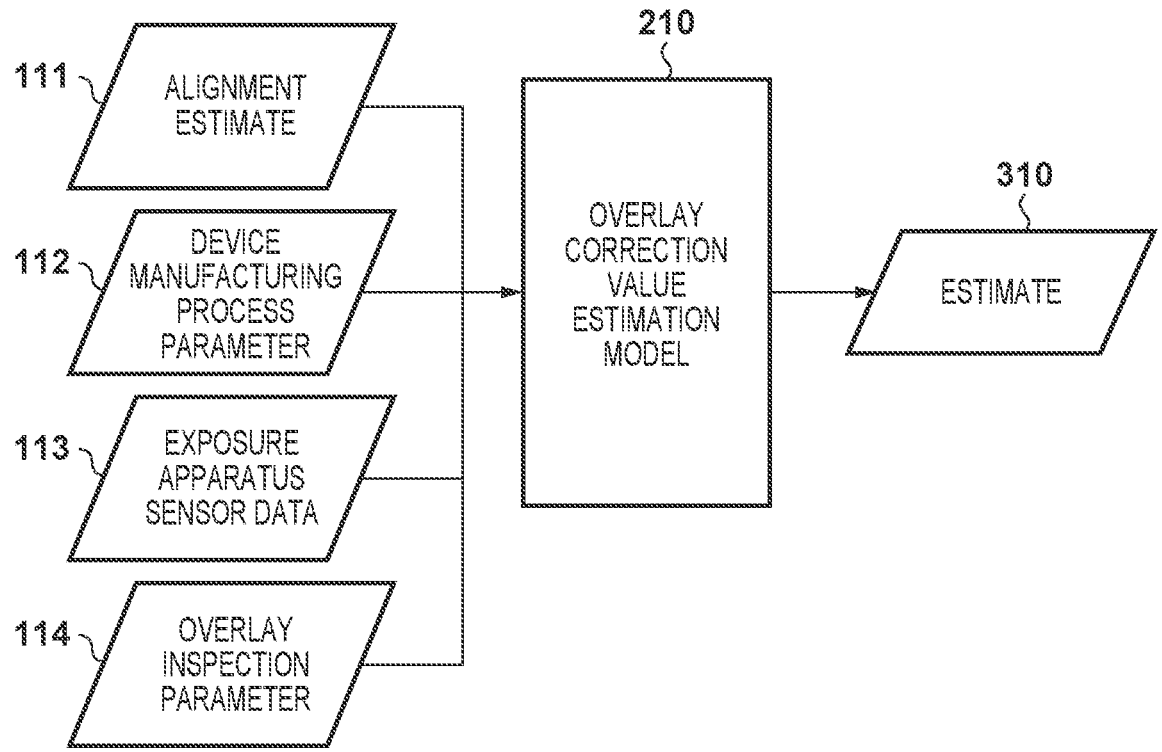
FIG. 14 is a view showing a configuration example of a Virtual Metrology system that estimates an overlay measurement value.

FIG. 14 shows a configuration example of the Virtual Metrology system that estimates an overlay measurement value according to the second embodiment. In this system, the following data serve as input data to an overlay measurement value estimation model 210:
an alignment estimate 111;
a device manufacturing process parameter 112;
an exposure apparatus sensor data 113; and
an overlay inspection parameter 114.

The alignment estimate 111 can be the estimate 300 which is an output data of the estimation model 200 according to the first embodiment. Alternatively, as for the alignment estimate 111, the input data of the estimation model 200 according to the first embodiment, which serves as the base of the estimate 300, may be used intact as an input to the estimation model 210. The device manufacturing process parameter 112 can include, for example, the ID of a development apparatus that processes a substrate having undergone exposure in the exposure apparatus, the measurement parameter, the pattern information of an original to be used, and the like. The exposure apparatus sensor data 113 can include, for example, the control deviations of the substrate stage and the original stage, the in-apparatus temperature at the time of in-apparatus temperature control, the measurement value of an accelerometer in the apparatus, and the like. The overlay inspection parameter 114 can include, for example, the measurement signal, apparatus log, or the like of the overlay inspection apparatus.

Based on the input data as described above, the overlay measurement value estimation model 210 estimates the overlay measurement value in each shot region, and outputs an estimate 310 of the overlay measurement value in each shot region. The estimation model 210 is a model in which the input/output relationship has been learned in advance by machine learning or the like.

Figure 15:
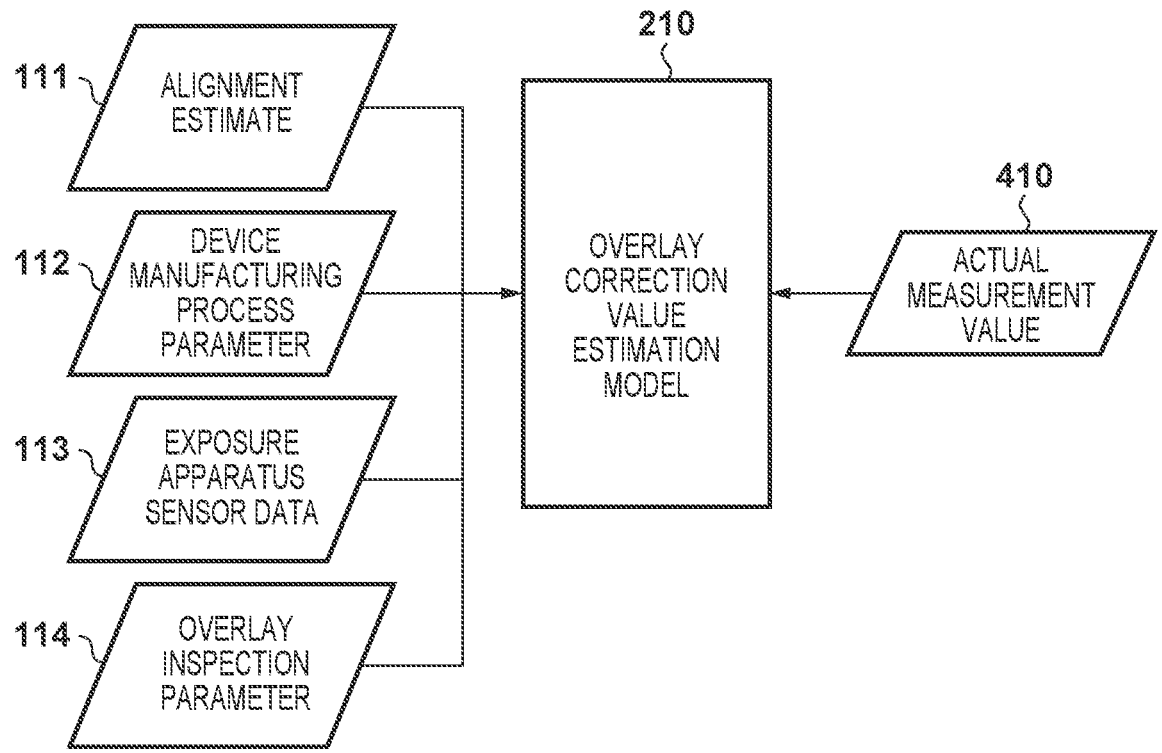
FIG. 15 is a view showing the data flow during learning of an overlay measurement value estimation model.

FIG. 15 shows the data flow during learning of the estimation model 210. In the second embodiment, a shot region where overlay measurement is performed is referred as a sample shot region. During learning, parameters inside the estimation model are learned while using an actual measurement value 410, which is the overlay measurement value in the shot region where overlay measurement was actually performed, as teacher data.

By using the estimate model 210 learned as described above, the overlay measurement value in a shot region (a shot region other than the sample shot region) where overlay measurement has not been performed is estimated. With this, the frequency of overlay inspection can be reduced, and the productivity is improved.

Note that a detailed description of a method of determining the sample shot region will be omitted here because the method is implemented by merely replacing the alignment measurement value in the first embodiment with the overlay measurement value. Also in this embodiment, it is possible to optimize the sample shot regions by the procedure similar to that in the first embodiment.

Third Embodiment

In the third embodiment, an exposure apparatus 1 has a function of giving a notification to a user if the expressive power of the estimation model is low. This function can be applied to either of the alignment measurement value estimation model according to the first embodiment and the overlay measurement value estimation model according to the second embodiment. A description will be given below while taking the alignment measurement value estimation model according to the first embodiment as an example.

Figure 16:
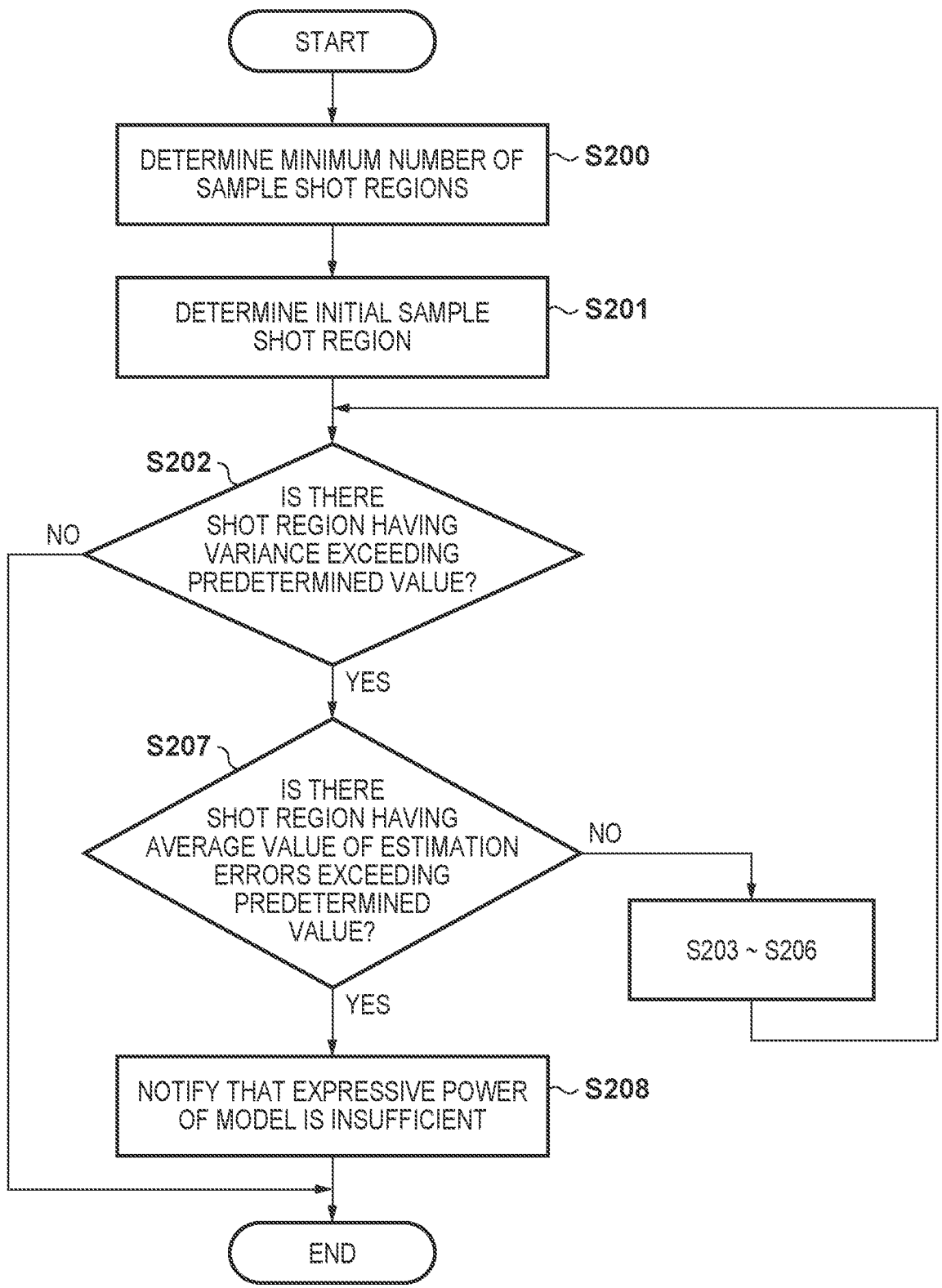
FIG. 16 is a flowchart illustrating a process of determining sample shot regions.

With reference to the flowchart of FIG. 16, a method of determining sample shot regions according to this embodiment will be described. The same step numerals as in the flowchart of FIG. 11 denote the same processing steps, and a description thereof will be omitted. In the flowchart of FIG. 16, step S207 is added between step S202 and step S203. In step S207, a controller C calculates, for each shot region, the average value of estimation errors, which are errors of estimates with respect to the measurement value obtained by actual measurement, and determines whether there is a shot region having the average value exceeding a predetermined value. If there is a shot region having the estimation error average value exceeding the predetermined value, this means that an error that cannot be expressed by the currently used estimation model has occurred in estimation of the alignment measurement value in the substrate surface. Accordingly, it is determined that the expressive power of the model is insufficient. In this case, in step S208, the controller C notifies the user that the expressive power of the model is insufficient. The notification is given by, for example, displaying, on a display unit, a message indicating that the expressive power of the model is insufficient. The notification may be given by sound or the like. With this, the user can grasp the timing when the estimation model needs to be modified.

Fourth Embodiment

In the fourth embodiment, an exposure apparatus has a function of detecting an abnormality of a measurement value. The range within which an alignment measurement value in each shot region normally falls can be empirically understood from the distribution of the alignment measurement value estimation model. Therefore, a controller C determines whether the measurement value obtained when performing alignment measurement in each sample shot region (step S304) falls within a predetermined range which is set based on the variance of the distribution of the estimate of the alignment measurement value calculated from the estimation model. If the measurement value falls outside the range, the controller C determines that the measurement value is a measurement abnormal value.

If a measurement abnormal value has been detected, the controller C can notify this to the user. The notification is given by, for example, displaying, on a display unit, a message indicating that the measurement abnormal value has been detected. The notification may be given by sound or the like. With this, the user can grasp the timing when the model needs to be modified.

Fifth Embodiment

In the fifth embodiment, the probability distribution of the regression coefficient at the position of each shot region in the substrate surface, which is obtained using the alignment measurement value estimation model according to the first embodiment or the overlay measurement value estimation model according to the second embodiment, is displayed as a map on a GUI. The representation upon displaying this can be, for example, the representation as shown in FIG. 9. The user can grasp the timing to perform a step improvement action giving attention to a shot region where the uncertainty is high.

Embodiment of Article Manufacturing Method

An article manufacturing method according to an embodiment of the present invention is suitable for manufacturing an article such as a microdevice, for example a semiconductor device, or an element having a microstructure. This article manufacturing method according to this embodiment includes a step of transferring the pattern of an original on a substrate by using a lithography apparatus (an exposure apparatus, imprinting apparatus, drawing apparatus, or the like), and a step of processing the substrate on which the pattern has been transferred in the preceding step. The manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-161328, filed Sep. 25, 2020, which is hereby incorporated by reference herein in its entirety.

What is claimed is:

1. A method of determining, out of a plurality of shot regions of a substrate, a set of sample shot regions in each of which a position of a mark is to be actually measured, comprising:

selecting one or more shot regions of the plurality of shot regions to set an initial arrangement of the set of sample shot regions;

determining a value indicating an uncertainty of an estimate of a measurement value of the position of the mark in each of a plurality of unselected shot regions using an estimation model for estimating a measurement value of a position of a mark in each of the plurality of shot regions; and adding, to the selected set of sample shot regions, a shot region, among the unselected shot regions for which the value indicating the uncertainty of the estimate of the measurement value of the position of the mark obtained using the estimation model exceeds a predetermined threshold value.

2. The method according to claim 1, wherein the estimation model receives input data including an overlay measurement value between an upper layer and a lower layer, a device manufacturing process parameter, a parameter of a sensor used in a lithography step, and a measurement value obtained by actually measuring the position of the mark in a sample shot region, and outputs the estimate of the measurement value of the position of the mark in the shot region other than the sample shot region.

3. The method according to claim 2, wherein the estimation model is a model in which an input/output relationship has been learned while using, as teacher data, the measurement value obtained by actual measurement of the position of the mark in the sample shot region.

4. The method according to claim 3, wherein the estimation model is a polynomial regression model that learns a regression coefficient of a polynomial from the teacher data.

5. The method according to claim 4, further comprising displaying information of a probability distribution of the regression coefficient on a display unit.

6. The method according to claim 4, wherein, in the adding, the unselected shot regions in each of which the value indicating the uncertainty exceeds the threshold value are extracted, and the shot region, among the extracted shot regions, having the largest value indicating the uncertainty is added to the selected set of sample shot regions.

7. The method according to claim 6, further comprising:
calculating a posterior distribution of a probability distribution of the regression coefficient after the shot region is added to the selected set of sample shot regions in the adding; and
calculating the value indicating the uncertainty of the estimate of the measurement value of the position of the mark in each shot region from the calculated posterior distribution,
wherein the adding, the calculating the posterior distribution, and the calculating the value are repeatedly performed until there is no shot region having the value, which is calculated in the calculating the value, indicating the uncertainty exceeding the threshold value.

8. The method according to claim 1, wherein the position of the mark is the position of the mark in a direction parallel to a surface of the substrate.

9. The method according to claim 1, wherein the position of the mark is the position of the mark in a direction perpendicular to a surface of the substrate.

10. The method according to claim 1, wherein
the position of the mark is a relative position between an overlay mark in an upper layer and an overlay mark in a lower layer.

11. The method according to claim 1, further comprising notifying a user of information of the selected set of sample shot regions.

12. The method according to claim 1, further comprising:
calculating an average value of estimation errors which are errors of the estimates with respect to a measurement value obtained by actual measurement; and
notifying a user if there is an unselected shot region in which the calculated average value exceeds a predetermined value.

13. The method according to claim 1, further comprising notifying a user if a measurement value obtained by actual measurement of the position of the mark in a sample shot region falls outside a predetermined range which is set based on the value indicating uncertainty.

14. The method according to claim 1, wherein the value indicating the uncertainty of the estimate includes a variance of the estimate.

15. A method of obtaining a measurement value of a position of a mark in each of a plurality of shot regions of a substrate, comprising:
measuring the position of the mark in each sample shot region included in a selected set of sample shot regions determined using a method defined in claim 1, and
estimating a measurement value of the position of the mark in each unselected shot region, which is not included in the selected set of sample shot regions, by using an estimation model and based on a measurement result of the mark in each sample shot region included in the selected set of sample shot regions.

16. A lithography apparatus comprising a substrate stage configured to position a substrate based on a measurement value of a position of a mark obtained using a method defined in claim 15.

17. An article manufacturing method comprising:
forming a pattern on a substrate by using a lithography apparatus defined in claim 16; and
processing the substrate on which the pattern has been formed,
wherein an article is manufactured from the processed substrate.

18. A computer-readable storage medium storing a program for causing a computer to perform each step of a method defined in claim 1.

19. The method according to claim 1, further comprising repeating the determining and adding steps until there is no unselected shot region of the plurality of unselected shot regions for which the value indicating the uncertainty of the estimate of the measurement value of the position of the mark obtained using the estimation model exceeds the predetermined threshold value.

20. An information processing apparatus that determines, out of a plurality of shot regions of a substrate, a set of sample shot regions in each of which a position of a mark is to be actually measured, comprising
a processing unit,
wherein the processing unit sets selects one or more shot regions of the plurality of shot regions to set an initial arrangement of the set of sample shot regions,
determines a value indicating an uncertainty of an estimate of a measurement value of the position of the mark in each of a plurality of unselected shot regions using an estimation model for estimating a measurement value of a position of a mark in each of the plurality of shot regions, and
adds, to the selected set of sample shot regions, a shot region, among the unselected shot regions for which the value indicating the uncertainty of the estimate of the measurement value of the position of the mark obtained using the estimation model exceeds a predetermined threshold value.

* * * * *